(12) United States Patent
Kajiyama

(10) Patent No.: US 8,208,289 B2
(45) Date of Patent: Jun. 26, 2012

(54) MAGNETORESISTIVE EFFECT ELEMENT

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 343 days.

(21) Appl. No.: 12/369,555

(22) Filed: Feb. 11, 2009

(65) Prior Publication Data

US 2009/0206426 A1    Aug. 20, 2009

(30) Foreign Application Priority Data

Feb. 15, 2008    (JP) .................................. 2008-035168

(51) Int. Cl.
*G11C 11/00*    (2006.01)
(52) U.S. Cl. ......... 365/158; 257/421; 365/171; 365/173
(58) Field of Classification Search .................. 365/158, 365/171, 173
See application file for complete search history.

(56) References Cited

U.S. PATENT DOCUMENTS

| | | | | |
|---|---|---|---|---|
| 6,221,172 | B1 * | 4/2001 | Saito et al. ..................... | 148/108 |
| 6,801,414 | B2 * | 10/2004 | Amano et al. ............. | 360/324.2 |
| 6,967,863 | B2 * | 11/2005 | Huai ............................. | 365/158 |
| 2005/0099724 | A1 * | 5/2005 | Nakamura et al. ............ | 360/125 |
| 2007/0076469 | A1 * | 4/2007 | Ashida et al. ................. | 365/158 |
| 2007/0086121 | A1 * | 4/2007 | Nagase et al. ............. | 360/324.1 |

FOREIGN PATENT DOCUMENTS

JP    2002-353418    12/2002

OTHER PUBLICATIONS

M. Hosomi, et al., "A Novel Nonvolatile Memory with Spin Torque Transfer Magnetization Switching: Spin-RAM," 2005 IEEE.
Explanation of Non-English Language Reference.

* cited by examiner

*Primary Examiner* — Alexander Sofocleous
(74) *Attorney, Agent, or Firm* — Knobbe, Martens, Olson & Bear, LLP

(57) ABSTRACT

A magnetoresistive element includes first, second, and third fixed layers, first, second, and third spacer layers, and a free layer. The first fixed layer is made of a ferromagnetic material and having an invariable magnetization direction. The first spacer layer is formed on the first fixed layer and made of an insulator. The free layer is formed on the first spacer layer, made of a ferromagnetic material, and having a variable magnetization direction. The second spacer layer is formed on the free layer and made of a nonmagnetic material. The second fixed layer is formed on the second spacer layer, made of a ferromagnetic material, and having an invariable magnetization direction. The third spacer layer is formed below the first fixed layer and made of a nonmagnetic material. The third fixed layer is formed below the third spacer layer, made of a ferromagnetic material, and having an invariable magnetization direction.

8 Claims, 2 Drawing Sheets

MAGNETORESISTIVE EFFECT ELEMENT

CROSS-REFERENCE TO RELATED APPLICATIONS

This application is based upon and claims the benefit of priority from prior Japanese Patent Application No. 2008-035168, filed Feb. 15, 2008, the entire contents of which are incorporated herein by reference.

BACKGROUND OF THE INVENTION

1. Field of the Invention

The present invention relates to a magnetoresistive effect element, and is used in, e.g., a magnetic memory having a memory cell including a tunneling magnetoresistive effect element.

2. Description of the Related Art

An application to a magnetic memory (MRAM: Magnetoresistive Random Access Memory) using a tunneling magnetoresistance (TMR) effect element (or a magnetic tunnel junction (MTJ) element) having a sandwiched structure of a ferromagnetic material/insulator/ferromagnetic material as a memory element has been proposed (see, e.g., Jpn. Pat. Appln. KOKAI Publication No. 2002-353418). In this application, spins in one ferromagnetic material layer are fixed (or made invariable) (a fixed layer or pinned layer), and those in the other ferromagnetic material layer are controlled (or made variable) (a free layer or recording layer), thereby changing the resistance between these ferromagnetic material layers in the sandwiched structure. The sandwiched structure is thus used as a memory.

In the magnetic memory (MRAM), the signal ratio of a write current to a read current is low, so the write operation and read operation are the same. When reading out data, therefore, a write error occurs because data is written by the read current owing to read disturb. To solve this problem, the variations in read current and write current must be controlled to a few %. To reduce the variations in read current and write current, it is necessary to reduce the variation in magnetization direction in the fixed layer of the magnetoresistive effect element.

BRIEF SUMMARY OF THE INVENTION

According to a first aspect of the present invention, there is provided a magnetoresistive effect element comprising: a first fixed layer made of a ferromagnetic material and having an invariable magnetization direction; a first spacer layer formed on the first fixed layer and made of an insulator; a free layer formed on the first spacer layer, made of a ferromagnetic material, and having a variable magnetization direction; a second spacer layer formed on the free layer and made of a nonmagnetic material; a second fixed layer formed on the second spacer layer, made of a ferromagnetic material, and having an invariable magnetization direction; a third spacer layer formed below the first fixed layer and made of a nonmagnetic material; and a third fixed layer formed below the third spacer layer, made of a ferromagnetic material, and having an invariable magnetization direction.

According to a second aspect of the present invention, there is provided a magnetoresistive effect element comprising: a first fixed layer made of a ferromagnetic material and having an invariable magnetization direction; a free layer made of a ferromagnetic material and having a variable magnetization direction; a first spacer layer formed between the first fixed layer and the free layer and made of an insulator; a second spacer layer formed on a surface of the free layer, which is opposite to a surface on which the first spacer layer is formed, and made of a nonmagnetic material; and a second fixed layer formed on a surface of the second spacer layer, which is opposite to a surface on which the free layer is formed, and having an invariable magnetization direction.

DETAILED DESCRIPTION OF THE INVENTION

Figure 1:
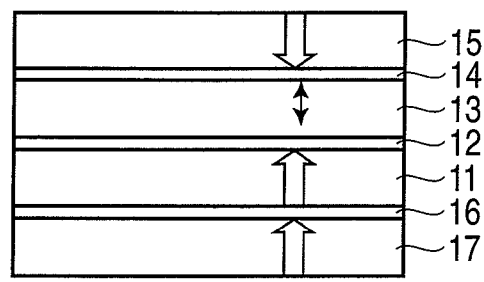
FIG. 1 is a sectional view showing the structure of a tunneling magnetoresistive effect element of a first embodiment of the present invention.

Embodiments of the present invention will be explained below with reference to the accompanying drawing. In the following explanation, the same reference numerals denote the same parts throughout the drawing.

First Embodiment

First, a tunneling magnetoresistive effect element of the first embodiment of the present invention will be explained below. FIG. 1 is a sectional view showing the structure of the tunneling magnetoresistive effect element of the first embodiment.

As shown in FIG. 1, the tunneling magnetoresistive effect element of the first embodiment has a structure in which a free layer 13 is formed on a first spacer layer (tunnel insulating film) 12 on a first fixed layer (pinned layer) 11. A second fixed layer 15 is formed on a second spacer layer 14 on the free layer 13. In addition, a third fixed layer (adjusting pinned layer) 17 is formed on a third spacer layer 16 below the first fixed layer 11. The third fixed layer 17 is an adjusting fixed layer for adjusting the magnetization direction in the first fixed layer 11.

In other words, the spacer layer 16 is formed on the fixed layer 17, and the fixed layer 11 is formed on the spacer layer 16. The spacer layer 12 is formed on the fixed layer 11, and the free layer 13 is formed on the spacer layer 12. The spacer layer 14 is formed on the free layer 13, and the fixed layer 15 is formed on the spacer layer 14.

The fixed layers 11, 15, and 17 and free layer 13 are made of a ferromagnetic material. The spacer layers 12, 14, and 16 are made of a nonmagnetic material. The magnetization direction is invariable in the fixed layers 11, 15, and 17, and variable in the free layer 13. More specifically, the magnetization direction is controlled to point in a first direction in the fixed layers 11, 15, and 17, and controlled to point in the first direction or a second direction parallel and opposite to the first direction in the free layer 13. The magnetization directions in the fixed layers 11, 15, and 17 and free layer 13 are perpendicular magnetization, i.e., perpendicular to the layer plane.

Figure 2A:
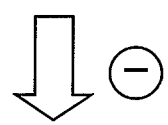
FIGS. 2A and 2B are views showing spin transfer in the tunneling magnetoresistive effect element of the first embodiment.
Figure 2A:
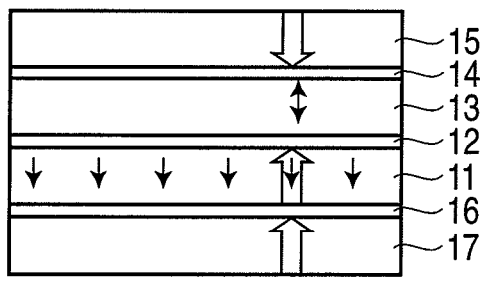
Figure 2B:
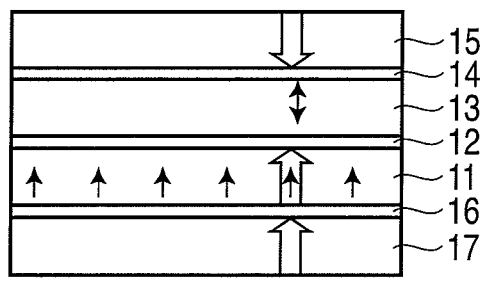

The tunneling magnetoresistive effect element having the structure as described above has the following operation principle. In spin transfer as shown in FIGS. 2A and 2B, electron spins having the same direction as that of spins in a fixed layer as the destination of transfer are often transferred. Accordingly, when reversing spins downward when rewriting data in the free layer 13 by a perpendicular spin transfer method, as shown in FIG. 2A, electrons are supplied from the side of the fixed layer 15 (from above), and spins existing in the fixed layer 15, i.e., downward spins in this case, are transferred to the free layer 13. On the other hand, when reversing spins upward, as shown in FIG. 2B, electrons are supplied (from below), and spins existing in the fixed layer 15, i.e., upward spins in this case, are transferred to the free layer 13.

In an MRAM using the tunneling magnetoresistive effect element, the same current path is used for both data write and read. Since the operation margin is small, a disturb error readily occurs. This makes it necessary to reduce the variation in magnetization direction in the fixed layer 11.

Figure 3A:
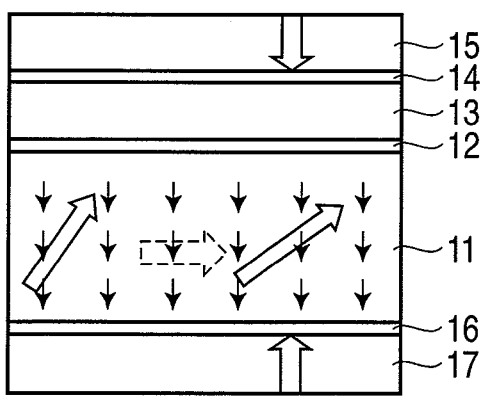
FIGS. 3A and 3B are views showing spin transfer in the tunneling magnetoresistive effect element of the first embodiment.
Figure 3B:
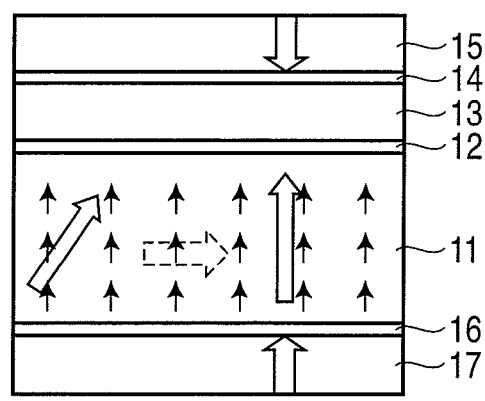

As shown in FIGS. 3A and 3B, however, processing damage or the like varies the magnetization direction in the fixed layer 11, and this variation is regarded as a problem.

It is an object of the embodiment of the present invention to reduce the variation in magnetization direction in the fixed layer 11. The method is to directly apply a write operation for the free layer 13 to the fixed layer 11. That is, as shown in FIGS. 3A and 3B, the spin direction (magnetization direction) in the fixed layer 11 is adjusted by transferring spins to the fixed layer 11. When the spins in the fixed layer 11 are upward, as shown in FIG. 3A, transfer of downward spins further breaks the perpendicularity. By contrast, as shown in FIG. 3B, transfer of spins (upward spins) in the same direction as that of spins in the fixed layer 11 increases the anisotropy of magnetization. That is, the variation in magnetization direction in the fixed layer 11 can be reduced.

When transferring spins from the side of the fixed layer 15 (from above), spin transfer can be performed with magnitude that affects spins in the fixed layer 11 by using exactly the same method as that of write to the free layer 13. However, the conventional dual structure cannot achieve the effect of increasing the anisotropy of magnetization in the fixed layer in the opposite direction. Accordingly, the first embodiment has the structure in which the spacer layer 16 and the fixed layer 17 for adjusting the fixed layer 11 are formed below the fixed layer 11 as shown in FIG. 1. This makes it possible to transfer spins both upward and downward to the fixed layer 11, and adjust the variation in magnetization direction in the fixed layer 11.

The order of the magnitude of the coercive force is the fixed layer 17 for adjustment>the fixed layer 11 for TMR>the free layer 13. Also, a material having a high exchange coupling value such as Ru is not used as the spacer layer 16 so that the spacer layer 16 does not take a synthetic free layer structure by exchange coupling. When using a material having a low exchange coupling value such as Cu, the fixed layers 11 and 17 having the same magnetization direction can be formed above and below the spacer layer 16 as shown in FIG. 1, unlike synthetic free layers.

Examples of the material having a high exchange coupling value are Ru, Re, and Ir. Examples of the material having a low exchange coupling value are Ti, V, Cr, Cu, Zr, Nb, Mo, Ta, W, Re, Pt, and Au. An example of this exchange coupling value is "magnitude of the antiferromagnetic exchange-coupling strength J0 (erg/cm$^2$)". Since the above-mentioned adjustment of the variation in magnetization direction is performed for the fixed layer, the effect can be achieved by periodically performing the adjustment when shipping or using the product.

The first embodiment can provide a magnetoresistive effect element capable of adjusting the variation in magnetization direction in the fixed layer. This makes it possible to reduce the variations in read current and write current of an MRAM having the magnetoresistive effect element, and ensure a large operation margin.

Second Embodiment

A tunneling magnetoresistive effect element of the second embodiment of the present invention will now be explained. The same reference numerals as in the arrangement of the first embodiment described above denote the same parts, and a repetitive explanation will be omitted.

Figure 4:
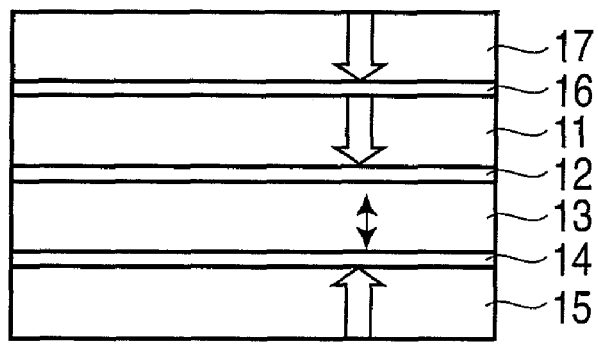
FIG. 4 is a sectional view showing the structure of a tunneling magnetoresistive effect element of a second embodiment of the present invention.

FIG. 4 is a sectional view showing the structure of the tunneling magnetoresistive effect element of the second embodiment.

A spacer layer 14 is formed on a fixed layer 15, and a free layer 13 is formed on the spacer layer 14. A spacer layer (tunnel insulating film) 12 is formed on the free layer 13, and a fixed layer 11 for TMR is formed on the spacer layer 12. In addition, a spacer layer 16 is formed on the fixed layer 11, and a fixed layer 17 is formed on the spacer layer 16.

In the first embodiment described above, if both the coercive forces of the fixed layer 15 and the fixed layer 17 for adjustment are larger than that of the fixed layer 11 for TMR, the spin direction (magnetization direction) in the TMR fixed layer 11 may vary depending on the magnetic field and film formation temperature of a magnetic field neutral film forming the fixed layer 15. By contrast, in the second embodiment, the spin directions in the fixed layer 11 for TMR and the fixed layer 17 for adjustment formed on it are the same. This advantageously facilitates processing. The rest of the arrangement and effect are the same as those of the first embodiment.

Third Embodiment

A tunneling magnetoresistive effect element of the third embodiment of the present invention will be explained below. The same reference numerals as in the arrangement of the first embodiment described above denote the same parts, and a repetitive explanation will be omitted.

Figure 5:
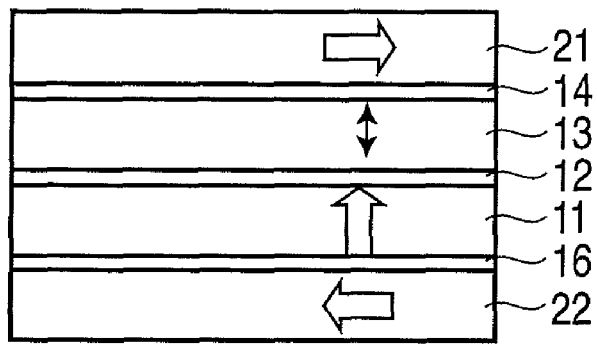
FIG. 5 is a sectional view showing the structure of a tunneling magnetoresistive effect element of a third embodiment of the present invention.

FIG. 5 is a sectional view showing the structure of the tunneling magnetoresistive effect element of the third embodiment.

In the first embodiment, the magnetization directions in the fixed layer 15 and the fixed layer 17 for adjustment are perpendicular magnetization, i.e., perpendicular to the layer plane. In the third embodiment, however, the magnetization directions in a fixed layer 21 and a fixed layer 22 for adjustment are in-plane magnetization, i.e., parallel to the layer plane.

A spacer layer 16 is formed on the fixed layer 22, and a fixed layer 11 for TMR is formed on the spacer layer 16. A spacer layer (tunnel insulating film) 12 is formed on the fixed layer 11, and a free layer 13 is formed on the spacer layer 12. In addition, a spacer layer 14 is formed on the free layer 13, and the fixed layer 21 is formed on the spacer layer 14.

In the tunneling magnetoresistive effect element having this structure, a torque component acting on the TMR fixed layer 11 has an angle, and this effectively increases an adjustment component in the magnetization direction in the fixed layer 11. The rest of the arrangement and effect are the same as those of the first embodiment.

Fourth Embodiment

A tunneling magnetoresistive effect element of the fourth embodiment of the present invention will be explained below. The same reference numerals as in the arrangement of the first embodiment described above denote the same parts, and a repetitive explanation will be omitted.

Figure 6:
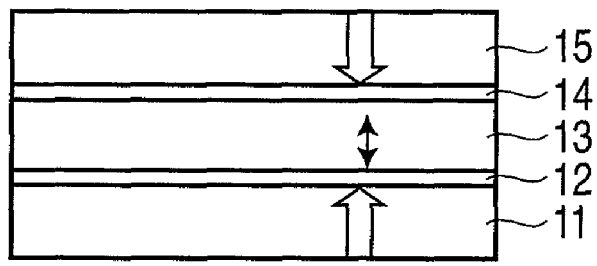
FIG. 6 is a sectional view showing the structure of a tunneling magnetoresistive effect element of a fourth embodiment of the present invention.

FIG. 6 is a sectional view showing the structure of the tunneling magnetoresistive effect element of the fourth embodiment.

A spacer layer (tunnel insulating film) 12 is formed on a fixed layer 11, and a free layer 13 is formed on the spacer layer 12. A spacer layer 14 is formed on the free layer 13, and a fixed layer 15 is formed on the spacer layer 14.

The magnetoresistive effect element of the fourth embodiment has no fixed layer for adjustment, and hence has a dual structure. The variation in magnetization direction in the free layer is adjusted by the write method described previously, thereby controlling the value of MR (MagnetoResistance) or the like. The operation is as follows. When writing data, not only a unidirectional write operation but also the first write operation is performed. Then, a read operation is performed, and electric currents are supplied from above and below until the value becomes a desired value, thereby performing a feedback operation. In this way, an operation like verification is performed. Although the write operation must be performed whenever data is written, the variation reducing effect can be obtained.

The embodiments of the present invention can each provide a magnetoresistive effect element capable of adjusting the variation in magnetization direction in the fixed layer.

Furthermore, the embodiments described above can be practiced singly, and can also be practiced as they are appropriately combined. In addition, each of the above embodiments includes inventions in various stages. Therefore, inventions in various stages can also be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive effect element comprising:
a first fixed layer made of a ferromagnetic material with a constant magnetization direction;
a first spacer layer formed on the first fixed layer and made of an insulator;
a free layer formed on the first spacer layer and made of a ferromagnetic material with a variable magnetization direction;
a second spacer layer formed on the free layer and made of a nonmagnetic material;
a second fixed layer formed on the second spacer layer, and made of a ferromagnetic material with a constant magnetization direction;
a third spacer layer formed below the first fixed layer and made of a nonmagnetic material; and
a third fixed layer formed below the third spacer layer, and made of a ferromagnetic material with a constant magnetization direction,
wherein the magnetization directions of the first fixed layer, the second fixed layer, the third fixed layer, and the free layer are perpendicular to the layer planes,
wherein the magnetization direction of the first fixed layer is adjusted by an electric current flowing between the second fixed layer and the third fixed layer, and
wherein the magnetization directions of the first fixed layer and the third fixed layer are the same as each other.

2. The element of claim 1, wherein a coercive force of the first fixed layer is smaller than those of the second fixed layer and the third fixed layer.

3. The element of claim 1, wherein the third spacer layer comprises at least one of Ti, V, Cr, Cu, Zr, Nb, Mo, Ta, W, Re, Pt, and Au.

4. A magnetoresistive effect element, comprising:
a first fixed layer made of a ferromagnetic material with a constant magnetization direction;
a first space layer formed on the first fixed layer and made of an insulator;
a free layer formed on the first spacer layer and made of a ferromagnetic material with a variable magnetization direction;
a second spacer layer formed on the free layer and made of a nonmagnetic material;
a second fixed layer formed on the second spacer layer, and made of a ferromagnetic material with a constant magnetization direction;
a third spacer layer formed below the first fixed layer and made of a nonmagnetic material; and
a third fixed layer formed below the third spacer layer, and made of a ferromagnetic material with a constant magnetization direction,
wherein magnetization directions in the first fixed layer and the free layer are perpendicular to the layer planes, and magnetization directions in the second fixed layer and the third fixed layer are of in-plane magnetization.

5. A magnetoresistive effect element comprising:
a first fixed layer made of a ferromagnetic material with a constant magnetization direction;
a free layer made of a ferromagnetic material with a variable magnetization direction;
a first spacer layer formed between the first fixed layer and the free layer and made of an insulator;
a second spacer layer formed on a surface of the free layer opposite to a surface on which the first spacer layer is formed, and made of a nonmagnetic material;
a second fixed layer formed on a surface of the second spacer layer opposite to a surface on which the free layer is formed, with a constant magnetization direction;
a third spacer layer formed on a surface of the first fixed layer opposite to a surface on which the first spacer layer is formed, and made of a nonmagnetic material; and
a third fixed layer formed on a surface of the third spacer layer opposite to a surface on which the first fixed layer is formed with a constant magnetization direction,
wherein the magnetization directions of the first fixed layer, the second fixed layer, the third fixed layer, and the free layer are perpendicular to the layer planes,
wherein the magnetization direction of the first fixed layer is adjusted by an electric current flowing between the second fixed layer and the third fixed layer, and
wherein the magnetization directions of the first fixed layer and the third fixed layer are the same as each other.

6. The element of claim 5, wherein a coercive force of the first fixed layer is smaller than those of the second fixed layer and the third fixed layer.

7. The element of claim 5, wherein the third spacer layer comprises at least one of Ti, V, Cr, Cu, Zr, Nb, Mo, Ta, W, Re, Pt, and Au.

8. A magnetoresistive effect element, comprising
a first fixed layer made of a ferromagnetic material with a constant magnetization direction;
a free layer made of a ferromagnetic material with a variable magnetization direction;
a first spacer layer formed between the first fixed layer and the free layer and made of an insulator;
a second spacer layer formed on a surface of the free layer opposite to a surface on which the first spacer layer is formed, and made of a nonmagnetic material;
a second fixed layer formed on a surface of the second spacer layer opposite to a surface on which the free layer is formed with a constant magnetization direction;
a third spacer layer formed on a surface of the first fixed layer opposite to a surface on which the first spacer layer is formed and made of a nonmagnetic material; and
a third fixed layer formed on a surface of the third spacer layer opposite to a surface on which the first fixed layer is formed with a constant magnetization direction,
wherein magnetization directions in the first fixed layer and the free layer are perpendicular to the layer planes, and magnetization directions in the second fixed layer and the third fixed layer are of in-plane magnetization.

* * * * *